United States Patent [19]

Okada et al.

[11] Patent Number: 4,907,063
[45] Date of Patent: Mar. 6, 1990

[54] SEMICONDUCTOR BODY, AND DEVICE FORMED THEREFROM, HAVING GROOVES WITH SILICON NITRIDE ON THE GROOVE SURFACES

[75] Inventors: Daisuke Okada; Akihisa Uchida; Toshihiko Takakura; Shinji Nakashima, all of Koganei; Nobuhiko Ohno, Tokorozawa; Katsumi Ogiue, Hinode, all of Japan

[73] Assignees: Hitachi, Ltd.; Hitachi Microcomputer Engineering, Ltd., both of Tokyo, Japan

[21] Appl. No.: 51,699

[22] Filed: May 20, 1987

Related U.S. Application Data

[62] Division of Ser. No. 661,116, Oct. 15, 1984, Pat. No. 4,700,464.

[30] Foreign Application Priority Data

Oct. 14, 1983 [JP] Japan ................. 58-190779

[51] Int. Cl.$^4$ .............. H01L 29/34; H01L 29/04; H01L 29/72
[52] U.S. Cl. ........................ 357/54; 357/34; 357/35; 357/50; 357/55; 357/59
[58] Field of Search .............. 357/54, 55, 50, 34, 357/35, 59 R, 59 H, 59 K

[56] References Cited

U.S. PATENT DOCUMENTS

| T104,102 | 4/1984 | Ho et al. | 357/59 H |
| 4,509,249 | 4/1985 | Goto et al. | 357/59 R |
| 4,635,090 | 1/1987 | Tamaki et al. | 357/54 |
| 4,661,832 | 4/1987 | Lechaton et al. | 357/35 |
| 4,663,832 | 5/1987 | Jambotkar | 357/50 |

FOREIGN PATENT DOCUMENTS

| 56-42367 | 4/1981 | Japan | 357/54 N |
| 59-92546 | 5/1984 | Japan | 357/50 |

Primary Examiner—Andrew J. James
Assistant Examiner—Ngan Van Ngo
Attorney, Agent, or Firm—Antonelli, Terry & Wands

[57] ABSTRACT

A semiconductor integrated circuit device is provided with polycrystalline silicon filling U-grooves etched in a semiconductor substrate to form isolation regions which prevent any short-circuiting between the polycrystalline silicon and electrodes or wiring formed on the semiconductor substrate. A silicon dioxide film is formed within the U-grooves, and a silicon nitride film and a silicon dioxide film are further formed thereon. The silicon nitride film has a high hardness which suppresses the development of crystal defects in the peripheral active regions due to the expansion of the surface of the polycrystalline silicon when it is oxidized. When the surface of the polycrystalline silicon is oxidized, the oxidation proceeds along the oxide film over the nitride film, so that the whole of the oxide film is formed thickly. Therefore, the silicon nitride film and the silicon dioxide film are provided with an increased margin against the etching used for forming contact holes.

38 Claims, 6 Drawing Sheets

SEMICONDUCTOR BODY, AND DEVICE FORMED THEREFROM, HAVING GROOVES WITH SILICON NITRIDE ON THE GROOVE SURFACES

This application is a Divisional application of application Ser. No. 661,116, filed Oct. 15, 1984 U.S. Pat. No. 4,700,464.

BACKGROUND OF THE INVENTION

The present invention relates to semiconductor techniques, and particularly to a technique of isolating elements which can be effectively utilized for the formation of element-isolating regions in a semiconductor integrated circuit device, for example.

Elements in a semiconductor integrated circuit device are conventionally isolated by a pn junction isolation method using diffusion layers, or by an oxidation film isolation method utilizing a local oxidation film formed over the surface of the substrate. With these isolation methods, however, the widths of the isolation regions are relatively wide, so that as the elements become smaller, the isolation regions occupy a proportionally larger area. This makes it difficult to increase the density of LSI devices. The applicants have therefore proposed an isolation technique called the U-groove isolation method whereby portions that act as isolation regions between the active regions of elements are cut to form U-shaped grooves (like a moat or trench, hereinafter referred to as U-grooves). A silicon dioxide film is formed within the U-grooves which are then filled with polycrystalline silicon. This forms element-isolating regions.

According to this U-groove isolation method, the surfaces of the polycrystalline silicon filling each U-groove must be thermally oxidized to form a silicon dioxide film. This prevents short-circuiting between the polycrystalline silicon in the U-grooves and the wiring formed on the surface of the substrate, or the electrodes formed in the vicinity of the wiring.

However, the oxidation of the surface of polycrystalline silicon in the U-shaped grooves results in an increase in volume, and stresses are generated which expand the openings of the U-grooves. These stresses distort the boundaries between each U-groove isolation region and the semiconductor region. Therefore, dislocations develop in the monocrystalline silicon and spread through the crystal to destroy the pn junctions of the elements.

For that reason, the applicants have developed the technique described below. As shown in FIG. 1, a silicon nitride film ($Si_3N_4$ film) of a high hardness is formed over the inner surface of a silicon dioxide film 3 formed within a U-shaped isolation groove 2 provided in the surface of a semiconductor substrate 1. When a silicon dioxide film 6 is formed over the surface of polycrystalline silicon 5 filling the U-groove 2, the silicon nitride film 4, of high hardness, absorbs the stresses produced by the expansion of the silicon dioxide film 6. This prevents the transmission of stress to the outer silicon crystal, and prevents the development of dislocations.

This technique has been disclosed in, for example, the journal "NIKKEI ELECTRONICS", Mar. 29, 1982, No. 287, pp. 90–101.

SUMMARY OF THE INVENTION

When manufacturing a semiconductor integrated circuit device using this technique, the inventors have discovered that the following problem occurs.

With the silicon nitride film 4 formed over the silicon dioxide film 3 within the U-groove 2, when the surface of the polycrystalline silicon 5 is oxidized, the growth rate of the parts of the silicon dioxide film in contact with the silicon nitride film 4 is smaller than that of the central part of the silicon dioxide film. Therefore, when a silicon nitride film 4a on the surface of the substrate 1 is subjected to etching in a subsequent step, the thickness of the silicon dioxide film 6 on the boundaries of the U-groove 2 becomes extremely small, as shown in FIG. 1. Consequently, short-circuiting can easily occur between the polycrystalline silicon 5 in the U-shaped groove and an electrode formed on the surface of the substrate in the vicinity of the U-groove. A mask for forming an electrode such as an emitter electrode must be formed so that a margin for mask alignment remains about the U-groove. This, however, reduces the density of integration of the circuit.

On the other hand, it is difficult to provide sufficient etching of the silicon nitride film 4 or the silicon dioxide film 6, if short-circuiting is prevented in this way.

For these reasons, the provision of the silicon nitride film 4 makes it difficult to maintain electrical insulation between the electrode or wiring and the polycrystalline silicon in the U-groove; i.e., it makes it difficult to increase the degree of integration, or flatten the surface of the substrate.

When dealing with a semiconductor integrated circuit device by adapting this isolation method based on grooves, the object of the present invention is to prevent short-circuiting between electrodes or writing formed on the surface of the substrate and a semiconductor material formed in a groove thereof, and control the development of crystal defects caused by the formation of isolation regions based upon grooves.

Another object of the present invention is to increase the degree of integration of a semiconductor integrated circuit device which uses this isolation method based on grooves.

A further object of the present invention is to enable the flattening of the surface of the substrate after isolation regions have been formed by grooves.

A further object of the present invention is to provide a semiconductor substrate having isolation based on grooves, and a method of providing such substrate.

These and othe objects as well as novel features of the present invention will become apparent from the following description in the specification and the accompanying drawings.

A representative example of the inventions disclosed in this specification is described below briefly.

A silicon nitride film is formed within a groove between regions in which elements will be formed, and a silicon dioxide film is then formed over the silicon nitride film. The silicon nitride film suppresses the development of crystal defects in the surrounding semiconductor region that result from the expansion of the surface of the polycrystalline silicon when it is oxidized in the grooves. When oxidizing the surface of the polycrystalline silicon, the oxidation proceeds along the silicon dioxide film, so that the whole of the silicon dioxide film is formed thickly. This helps to increase the margin of the silicon nitride film or silicon dioxide film for etching. Preferably, an initial silicon dioxide film is formed within the groove prior to formation of the silicon nitride film, so that the silicon nitride film is formed on the initial silicon dioxide film.

DESCRIPTION OF THE PREFERRED EMBODIMENT

Figure 1:
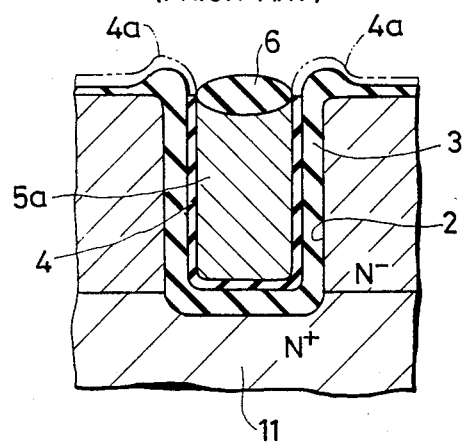
FIG. 1 is a section through the structure of a U-groove.

FIGS. 2 to 15 illustrate the sequence of manufacturing an embodiment in which the present invention is adapted to a bipolar type of semiconductor integrated circuit device in which the elements are isolated by the U-groove isolation method.

In this embodiment, a semiconductor body 10 (having a thickness, e.g., of d250 $\mu$m) is first prepared by the same process as that used for producing an ordinary bipolar type of integrated circuit device. Holes for the construction of buried layers are formed at suitable positions in a silicon dioxide film that is formed on the main surface of a semiconductor substrate 1 of p-type monocrystalline silicon. Using the silicon dioxide film as a mask, the substrate 1 is heavily doped with n-type impurities to form a local n$^+$-type buried layer 11 (of a thickness of, e.g., 2 $\mu$m). After the silicon dioxide film is remove, an n$^-$-type epitaxial layer 12 (of a thickness of, e.g., 1.4 $\mu$m) is grown on the substrate 1 by a vapor growth method. This provides the semiconductor body 10.

A silicon dioxide film (SiO$_2$) 14 (e.g., 1000 Angstrom thick) and a silicon nitride film (Si$_3$N$_4$) 15 (e.g., 2400 Angstrom thick) are formed on the main surface of the semiconductor body 10 by thermal oxidation and CVD, respectively. The silicon nitride film 15 and the silicon dioxide film 14 are removed by selective etching from portions at which isolation regions will be formed, i.e., they are removed from the periphery of bipolar transistors and the boundaries between base regions and collector contact regions.

Figure 2:
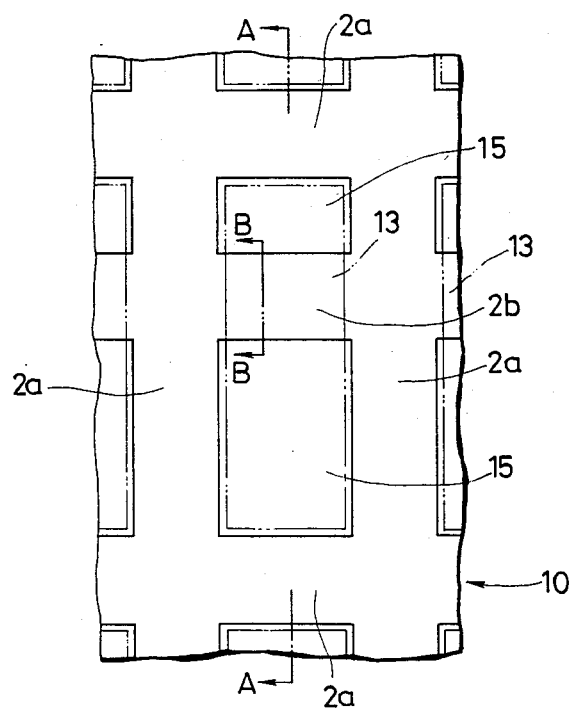
FIG. 2 is a plan view of U-grooves formed in a semiconductor substrate.
Figure 3:
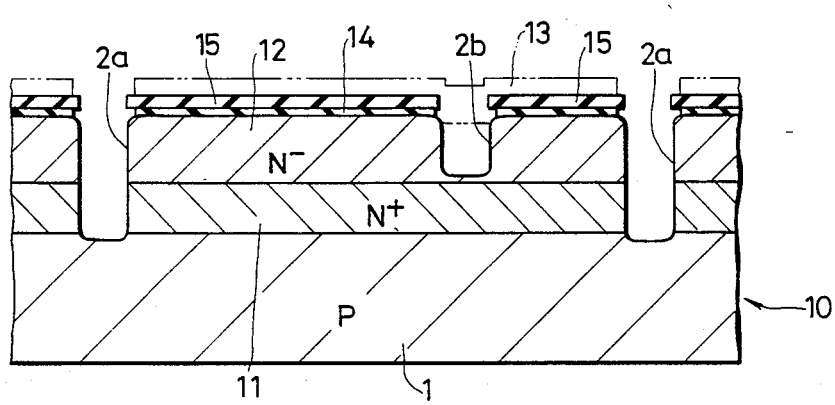
FIG. 3 is a section through the device of FIG. 2.

Using the silicon nitride film 15 as a main mask, the semiconductor body 10 is etched to form U-grooves 2a, 2b, such grooves respectively having widths of, e.g., 3.5 $\mu$m and 3 $\mu$m. This is shown in FIGS. 2 and 3. FIG. 3 is a section taken along the line A—A of FIG. 2. The silicon dioxide film 14 is not shown in FIG. 2.

First, using the silicon nitride film 15 as a mask, the surface of the semiconductor body 10 is etched selectively and shallowly (e.g., 0.6 $\mu$m depth) by anisotropic etching using hydrazine. The anisotropic etching of the semiconductor body is performed for tapering the edge of the groove. In accordance with the tapering, stresses applied to the edge are reduced to a lower level. With respect to such etching, if the main surface of the substrate 1 (or epitaxial layer 12) has (100) crystal plane, the plane at the tapering surface after the etching would correspond, for example, to the (111) crystal plane. A photoresist film 13 is then formed so as to cover at least boundary portions between base regions and collector contact regions. Initial dry etching (to a depth of 2.5 $\mu$m, for example) is done using the silicon nitride film 15 and the photoresist film 13 as masks. This makes it possible to form a relatively shallow U-groove 2a around the periphery of each bipolar transistor. The photoresist film 13 is removed, and a second dry etching step (to a further depth of 0.8 $\mu$m, for example) is done. This ensures that a relatively shallow U-groove 2b (of a depth of about 0.8 $\mu$m, for example) is formed in each boundary portion between the base regions and the collector contact regions, and the U-groove 2a is deepened around the peripheral portion thereof. The U-grooves 2a are formed so that they extend as far as the p-type substrate 1, through the n$^+$-type buried layer 11, and the U-grooves 2b are formed as far as a point just before the n$^+$-type buried layer 11.

The U-groove isolation regions are then formed according to steps shown in FIGS. 4 to 8, which are sections taken along the line B—B of FIG. 2. Although FIGS. 4 to 8 only show a U-groove 2b, the U-grooves 2a are formed by exactly the same steps.

Figure 4:
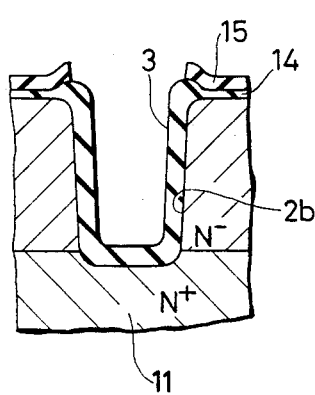
FIGS. 4 to 8 are partial sections on an enlarged scale of steps of filling the U-groove of FIG. 3.
Figure 5:
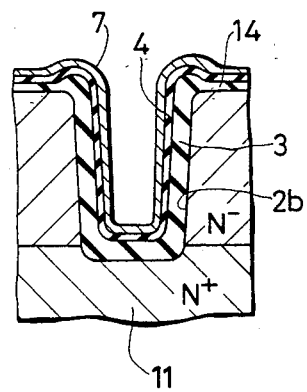

Using the silicon nitride film 15 as a mask, the exposed semiconductor body is thermally oxidized so that a silicon dioxide film 3 (of a thickness of e.g., 4000 Angstrom) is formed within each U-groove 2b, as shown in FIG. 4. As can be seen in FIG. 4, such thermal oxidation provides the silicon dioxide film to extend into n$^{30}$-type buried layer 11. The silicon dioxide film 3 is provided for reducing a parasitic capacitance between the element-forming regions. The material of this film 3 may be changed to another insulating material such as SiO$_2$ produced by chemical vapor deposition, phospho-silicate glass (PSG), or boron-silicate glass (BSG), which is deposited on the surface of the groove. However, in using any of these other materials, the film is deposited also on the main surface of the semiconductor body with the sae tickness as on the groove. As a result, selective etching of the film becomes difficult. Accordingly, it is desirable that the film 3 be formed by selective thermal oxidation of the body.

After the silicon nitride film 15 is removed, a silicon nitride film 4 (of a thickness of, e.g., 500 Angstrom) is formed over the silicon dioxide film 3 by a CVD method, and then a thin polycrystalline silicon layer 7 (thickness of 500 Angstrom, for example) is formed over the silicon nitride film 4 CVD.

The polycrystalline silicon layer 7 is thermally oxidized to provide a silicon dioxide film (SiO$_2$ film) 7a (of about 1000 Angstrom thickness, for example).

According to this method, the silicon dioxide film 7a can be formed thickly, and the film thickness can be easily controlled.

Instead of the thermally-oxidized film 7a, a silicon dioxide film formed by CVD can be used. However, if such silicon dioxide film formed by CVD is used, the thickness of such film should be greater than that of thermally-oxidized film 7a in view of the greater etching speed of CVD-formed silicon oxide as compared with that of the thermally-oxidized film. After contact holes for connecting the emitter and base regions to their electrodes have been etched, a thermally-oxidized film should preferably be formed to maintain a good electric insulation between each electrode and the polycrystalline silicon.

Figure 6:
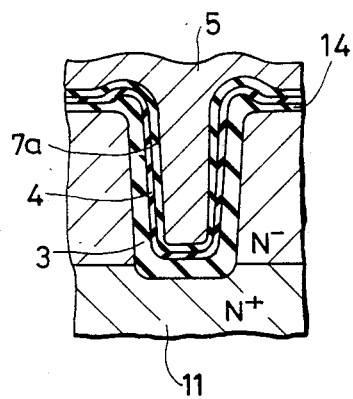

As shown in FIG. 6, the polycrystalline silicon 5 is deposited thickly over the whole surface of the semiconductor body 10 so as to fill the grooves covered with the silicon dioxide film 7a.

Figure 7:
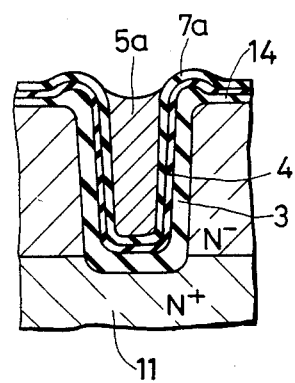

The surface of the polycrystalline silicon 5 is removed by dry etching, leaving polycrystalline silicon 5a in the U-grooves 2a and 2b, as shown in FIG. 7.

Figure 8:
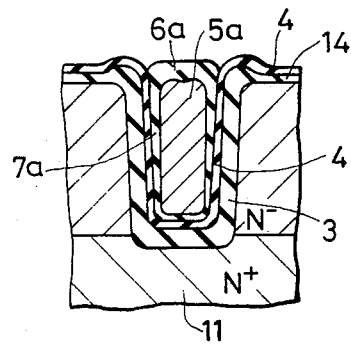

The silicon dioxide film 7a exposed on the surfaces other than those of the U-grooves 2a, 2b is removed by wet etching, and the surfaces of the polycrystalline silicon 5a in the U-grooves 2a, 2b are thermally oxidized to form silicon dioxide film 6a. Such silicon dioxide film 6a has a thickness, e.g., greater than the thickness of the silicon dioxide film 7a. As an example, this film 6a has a thickness of 4000 Angstrom at the center and 5000–6000 Angstrom at the "bird's beaks". Since the silicon dioxide film 7a is formed within the U-grooves, the oxidation proceeds along the silicon dioxide film 7a using the same mechanism as the development of "bird's beaks". As shown in FIG. 8, therefore, both edges of the silicon dioxide film 6a near the surface have a larger thickness than those of FIG. 1. The silicon dioxide film 7a over the regions other than those of the U-grooves 2a, 2b may be removed after the silicon dioxide film 6a has been formed, rather than before as described previously.

The silicon nitride film 4 exposed on the surfaces other than those of the U-grooves is removed by etching. N-type impurities such as phosphorus ions are then heavily diffused or implanted into the surface of portions at which collector contact regions will be formed, and p-type impurities such as boron ions are implanted in the surface of portions at which base regions will be formed.

Figure 9:
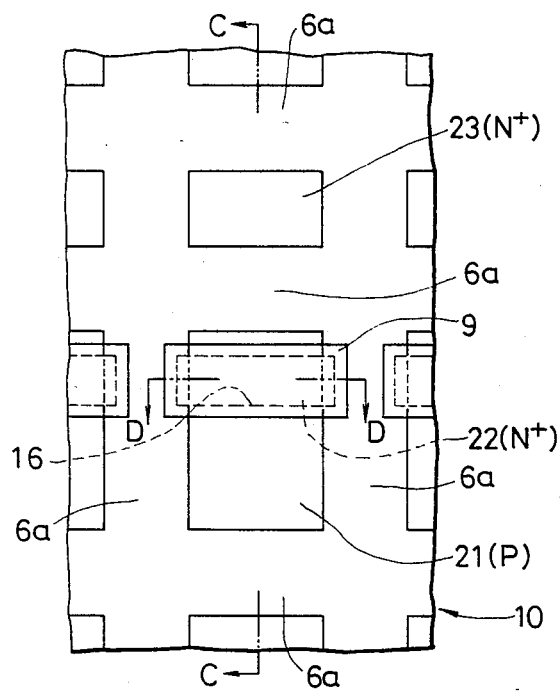
FIG. 9 is a plan view showing how emitter electrodes are formed.
Figure 10:
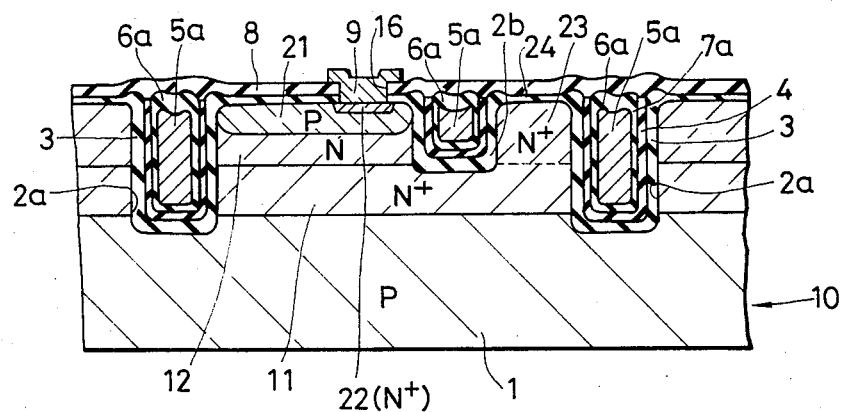
FIGS. 10 and 11 are sections through the device of FIG. 9.
Figure 11:
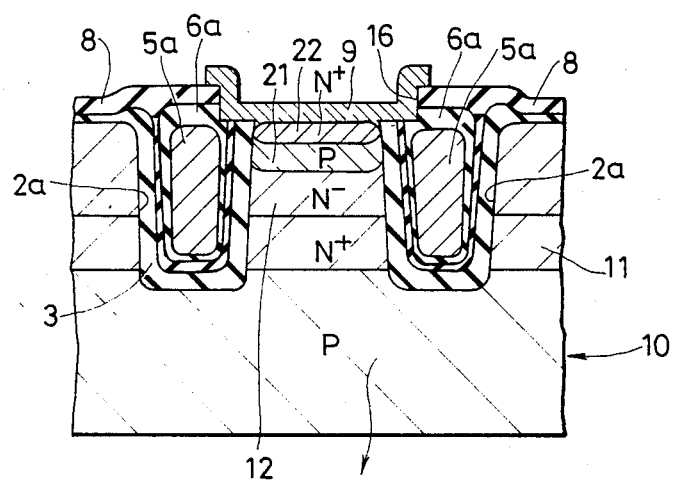

Emitter regions and emitter electrodes of polycrystalline silicon are then formed, as shown in FIGS. 9, 10 and 11. FIGS. 10 and 11 are sections taken along the line C—C and the line D—D, respectively, of FIG. 9. FIG. 9 does not show any insulation films 24 and 8. FIG. 10 is the cross section of only one bipolar transistor, it does not show any other bipolar transistors. This is also true for FIGS. 11, 13, 14 and 15.

A silicon dioxide film 24 and a silicon nitride film 8 are newly formed over the whole surface of the semiconductor body 10 by a CVD method. A PSG (phosphosilicate glass) film may be formed instead of the silicon nitride film 8. The silicon dioxide film 24 and the silicon nitride film 8 are selectively removed from the portion at which the emitter region will be formed, so that a hole 16 is formed for the emitter region. A polycrystalline silicon electrode 8 is formed on the surface of the portion at which the emitter region will be formed, so that the emitter region will be shallow. N-type impurities such as arsenic ions are implanted into the polycrystalline silicon electrode 9. The impurities are then thermally diffused simultaneously with a heat treatment which forms a p+-type semiconductor region 21 that acts as the base region, an n+-type semiconductor region 22 that acts as the emitter region, and an n30-type semiconductor region 23 that acts as the collector contact region. As can be appreciated, conventional processing techniques can be used for forming these regions.

According to this embodiment as shown in FIG. 11, two edges of the n+-type emitter region 22 are brought into contact with U-groove isolation regions (hereinafter, this is referred to as a walled emitter). The walled emitter is suitable for increasing the degree of integration since it eliminates the need of a margin for mask alignment between the isolation region and the hole 16 for the emitter region. According to the embodiment, short-circuiting can be prevented between the polycrystalline silicon electrode 9 and the polycrystalline silicon 5a in the U-shaped grooves, even if a walled emitter is employed.

When a walled emitter is employed, the hole 16 must be formed so that it overlaps the isolation regions, as shown in FIGS. 9 and 11. Therefore, the silicon nitride film 4, silicon dioxide film 6 and silicon nitride film 8 over the isolation regions are etched. Accordingly, the emitter electrode 9 is also formed on the silicon dioxide film 6 of which the thickness is reduced by etching. Overetching must be done to completely remove the silicon nitride film 8 from the region where the emitter region will be formed, so that the silicon dioxide film 6 is inevitably subjected to the etching as well.

If the peripheral edge of the silicon dioxide film 6 is thin, as shown in FIG. 1, the polycrystalline silicon 6a and the polycrystalline silicon electrode 9 may short-circuit at the peripheral edge of the silicon dioxide film 6 in the step in which the silicon dioxide film 6 is etched. According to this embodiment, however, the oxide film 7a is formed within the U-groove, so that the peripheral portions of silicon dioxide film 6 have a sufficiently large thickness. This helps prevent short-circuiting between the polycrystalline silicon electrode 9 and the polycrystalline silicon 5a. By employing this walled emitter structure, therefore, the dimensions of transistors can be reduced, the degree of integration of LSI devices can be increased, and the transistors can be operated at increased speeds.

Figure 12:
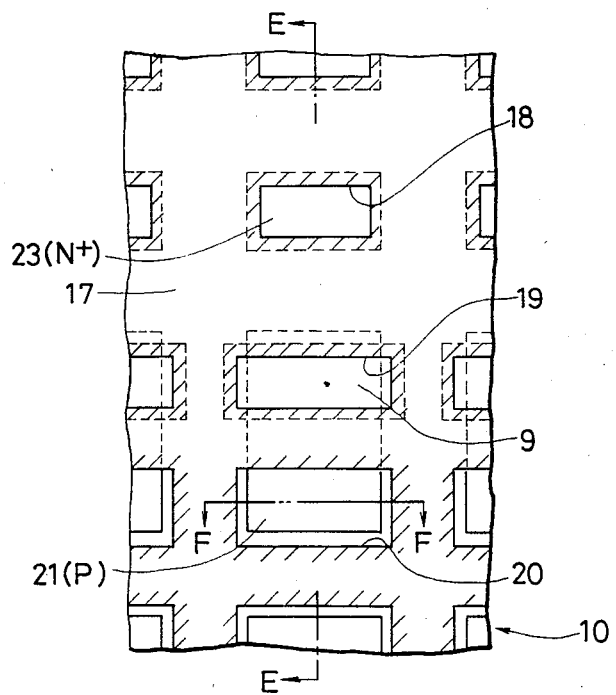
FIG. 12 is a plan view showing how contact holes are formed to connect aluminum wiring.
Figure 13:
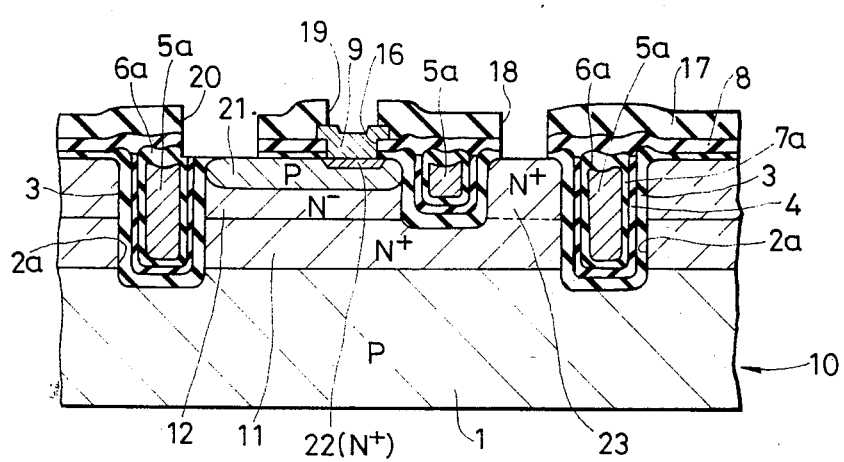
FIGS. 13 and 14 are sections through the device of FIG. 12.
Figure 14:
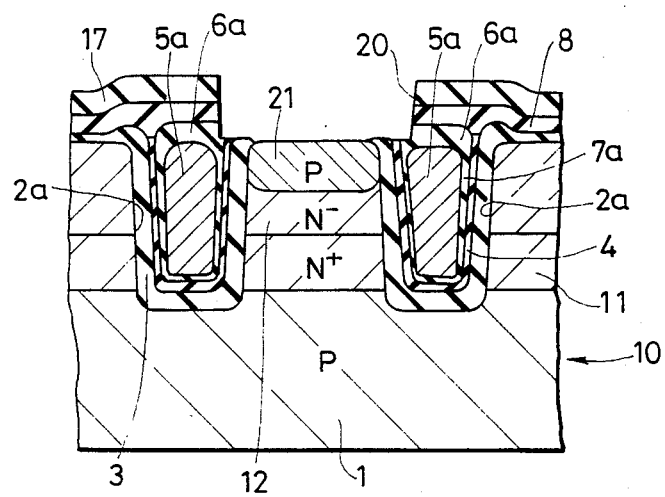

An intermediate insulation film 17 and contact holes 18, 19 and 20 are then formed, as shown in FIGS. 12, 13 and 14. FIGS. 13 and 14 are sections taken along the line E—E and the line F—F, respectively, of FIG. 12.

The intermediate insulation film 17, such as a PSG film, is first formed by a CVD method over the whole surface of the semiconductor body 10. Contact holes 18, 19 and 20 are then formed for the base, emitter and collector, using photoresist as a mask.

The contact hole for the connection of aluminum wiring to the base region is formed so that it overlaps the isolation regions. No margin for mask alignment is required between the contact hole and the isolation regions. Even if this margin for mask alignment is eliminated, to increase the degree of integration, short-circuiting between the polycrystalline silicon 5a in the U-grooves and the base electrode is prevented.

Figure 15:
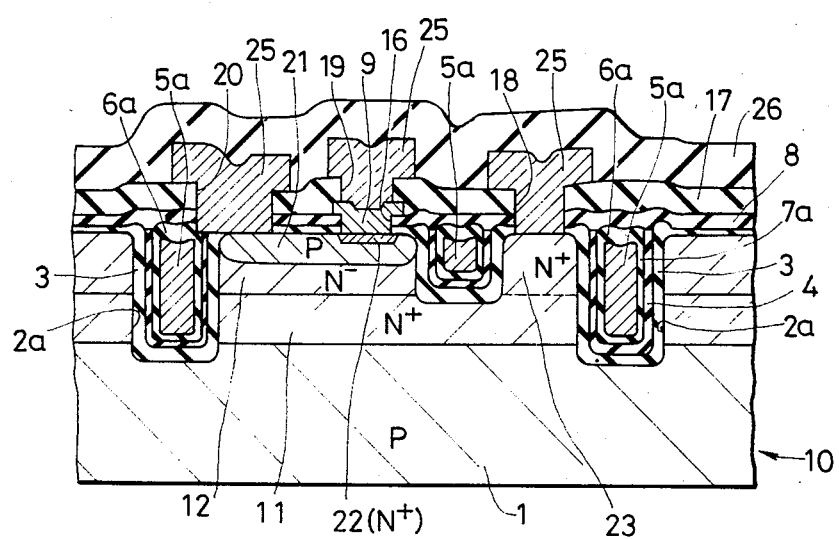
FIG. 15 is a section through a semiconductor integrated circuit device according to the present invention.

Next, as shown in FIG. 15, a wiring material such as aluminum is deposited by evaporation over the whole surface of the semiconductor body 10, aluminum electrodes and aluminum wiring 25 are formed by photolithography, and a final passivation film 26 is formed thereon.

According to the present invention, in which the margin for mask alignment is eliminated to increase the degree of integration, short-circuiting between individual electrodes and the polycrystalline silicon in the U-grooves is prevented, and the production yield can be improved. The margin against overetching due to washing and etching of the silicon dioxide film 6 is also increased. Acccording to this embodiment, the silicon nitride film 4 is barely etched in the step of removing the polycrystalline silicon 5, since the oxide film 7 has been formed on the surface of the silicon nitride film 4. Accordingly, the thickness of the silicon nitride film 4 can be reduced to such a degree that crystal defects (dislocations) will not develop. This means that overetching can be reduced when the silicon nitride film 4 is etched to flatten the surface; i.e., the surface can be flattened well.

As described above, U-grooves are formed in portions that will become isolation regions between regions in which elements are formed, a thermally-oxidized film is formed within each U-groove, and a nitride film and an oxide film are further formed thereon.

The silicon nitride film of a high hardness suppresses the development of crystal defects in the peripheral regions due to the expansion of the surface of the polycrystalline silicon when it is oxidized in the U-grooves.

In this construction, furthermore, the oxidation proceeds along the silicon dioxide film formed on the inner surface of the silicon nitride film, when the surface of the polycrystalline silicon is oxidized. Therefore, a thick silicon dioxide film can be formed over the whole surface of the polycrystalline silicon in the U-grooves. This helps increase the margin of the silicon nitride film and the silicon dioxide film against etching. Accordingly, because of the walled emitter structure, short-circuiting is prevented between the polycrystalline silicon in the U-grooves and the polycrystalline silicon electrode formed between the emitter and the tops of the U-groove isolation regions.

According to this construction, furthermore, the silicon nitride film and the silicon oxide film have an increased margin for etching, and it is possible to provide overetching for the oxide film over the U-groove isolation regions. Consequently, the surface of the substrate can be easily flattened.

The present invention provided by the inventors was described specifically above with reference to an embodiment thereof. It must, however, be noted that the present invention is in no way limited to this embodiment alone, but can be modified in a variety of ways without departing from the spirit of the invention.

Thus, the film formed on the silicon nitride film in the grooves can be appropriate insulating oxide such as PSG, BSG, or $SiO_2$ that is deposited by chemical vapor deposition, rather than, e.g. $SiO_2$ formed by thermal oxidation. This film formed on the silicon nitride, generally, is a material in which oxygen atoms are easily diffused. However, when this film is a material formed by procedures other than thermal oxidation, the distance between the edge of electrode 9 (FIG. 11) and the charged conductive material 5a is reduced to a small level since the etching speed or rate of each of the materials is relatively high as compared with that of the thermal oxide. Thus, in order to maintain desired distances, it is preferred that this film on the silicon nitride be formed by thermal oxidation.

Furthermore, other materials, such as aluminum, can be used instead of polycrystalline silicon to fill up the grooves. Such materials must be able to be thermally oxidized, to form an insulator; note the polycrystalline silicon 5a and thermally oxidized $SiO_2$ film 6a in FIG. 11.

This above-described embodiment dealt with the case in which the present invention was adapted to a semiconductor integrated circuit device in which elements were isolated by the U-groove isolation method. The present invention should not, however, be limited to the case in which elements are isolated by the U-groove isolation method. For instance, the invention can be adapted to any isolation technique in which grooves are formed and a semiconductor material is deposited thereon to provide isolation regions, like a V-groove isolation method. Although polycrystalline silicon is usually used as a semiconductor material, any material can be used, provided that it has an electric conductivity (that is, is at least semiconducting) such that leakage currents can flow between elements to a degree that cannot be ignored.

The mask for etching the grooves may be a silicon dioxide film or a double-layer film obtained by forming a silicon dioxide film over the silicon nitride film 15.

The hole 16 for forming the emitter may be formed so that three edges thereof overlap element isolation regions. That is, in FIG. 9, the edge thereof opposite the collector contact region may also form a walled emitter structure.

The contact hole 20 can be formed so that it does not overlap the element isolation regions. That is, it can be formed in a region in which an element will be formed, like the contact hole 18 of FIG. 12. Conversely, the contact hole 18 may be formed in the same way as the contact hole 20 of FIG. 12. In order to increase the degree of integration, it is essential to employ this walled emitter structure.

The foregoing description has chiefly illustrated a bipolar type of integrated circuit device that was used as a background for the invention. The present invention, however, need not necessarily be limited thereto but may be adapted, for instance, to MOS integrated circuit devices. The degree of integration can be increased by eliminating the margin for mask alignment between each contact hole for connecting an electrode to a source or drain region and the element isolation regions based upon the grooves. The invention can also be adapted to a semiconductor integrated circuit device of the type in which both bipolar transistors and MOS-FETs are used. The invention can further be adapted to a semiconductor integrated circuit device of the type which has first isolation regions utilizing grooves and second isolation regions of any other structure. The second isolation regions may be thick oxide films (field oxide films) obtained, for instance, by the local oxidation of the main surface of the semiconductor body. As described above, the present invention can be effectively adapted to semiconductor integrated circuit devices of various types.

While we have shown and described only one embodiment in accordance with the present invention, it is understood that the same is not limited thereto but is susceptible of numerous changes and modifications as known to one having ordinary skill in the art and we therefore do not wish to be limited to the details shown and described herein, but intend to cover all such modifications as are encompassed by the scope of the appended claims.

We claim:
1. A semiconductor body, including isolation regions for isolating semiconductor elements to be formed in said semiconductor body, comprising:
   (a) a semiconductor substrate having a main surface, with grooves formed in said main surface at locations of said isolation regions, the grooves providing groove surfaces of the semiconductor substrate;

(b) a silicon nitride film formed at least within said grooves over the groove surfaces of the semiconductor substrate;
(c) a first silicon dioxide film formed at least in said grooves on said silicon nitride film;
(d) a material that is at least semiconducting formed on said first silicon dioxide film so as to fill said grooves, said material having a surface; and
(e) a second silicon dioxide film which covers the surface of said material that is at least semiconducting.

2. A semiconductor body according to claim 1, wherein said second silicon dioxide film, together with said first silicon dioxide film, form a unitary structure.

3. A semiconductor body according to claim 1, further comprising a third silicon dioxide film, formed in the grooves between the groove surfaces of the semiconductor substrate and the silicon nitride film.

4. A semiconductor body according to claim 1, wherein said grooves are U-grooves.

5. A semiconductor body according to claim 1, wherein said second silicon dioxide film has a thickness greater than that of the first silicon dioxide film.

6. A semiconductor body according to claim 1, wherein the material that is at least semiconducting is polycrystalline silicon.

7. A semiconductor body according to claim 1, wherein said grooves include a first set of grooves and a second set of grooves, the second set of grooves extending to a greater depth from the main surface of the semiconductor substrate than the depth from the main surface of the semiconductor substrate that the first set of grooves extends.

8. A semiconductor integrated circuit device provided with isolation regions for isolating elements formed in a semiconductor body by utilizing grooves that are formed by etching a main surface of said semiconductor body, thereby providing groove surfaces of the semiconductor body, said isolation regions comprising:
(a) an initial silicon dioxide film formed on the groove surfaces of the semiconductor body;
(b) a silicon nitride film formed at least on the groove surfaces of the semiconductor body;
(c) a first silicon dioxide film formed at least in said grooves on said silicon nitride film;
(d) a material that is at least semiconducting formed on said first silicon dioxide film so as to fill said grooves; the material having a surface; and
(e) a second silicon dioxide film which covers the surface of said material that is at least semiconducting, said second silicon dioxide film, together with said first silicon dioxide film, forming a unitary structure.

9. A semiconductor integrated circuit device according to claim 8, wherein said second silicon dioxide film is thicker than said first silicon dioxide film.

10. A semiconductor integrated circuit device according to claim 8, wherein the material that is at least semiconducting is polycrystalline silicon.

11. A semiconductor integrated circuit device comprising:
(a) a semiconductor body which has a main surface and which comprises a semiconductor substrate of a first conductivity type, a buried layer of a second conductivity type, and an epitaxial layer of said second conductivity type;
(b) isolation regions defined by grooves formed by etching said semiconductor body, the grooves defining groove surfaces of the semiconductor body, each of said isolation regions comprising an initial silicon dioxide film formed on the groove surfaces of the semiconductor body, a silicon nitride film formed at least on the initial silicon dioxide film, a first silicon dioxide film formed at least within said grooves on said silicon nitride film, a material that is at least semiconducting formed in said grooves over said first silicon dioxide film so as to fill up said grooves, and a second silicon dioxide film which covers the surface of said material that is at least semiconducting and which is formed such that said first silicon dioxide film and said second silicon dioxide film form a unitary structure;
(c) bipolar transistors formed in said semiconductor body, each of said bipolar transistors comprising a collector region in said buried layer, a collector contact region of said second conductivity type formed in a portion of said epitaxial layer, a base region of said first conductivity type formed in a portion of said epitaxial layer, and an emitter region of said second conductivity type formed in a portion of said base region; and
(d) electrodes for supplying electric current to said bipolar transistors, each of said bipolar transistors being provided with a first electrode in contact with said collector contact region, a second electrode in contact with said base region, and a third electrode in contact with said emitter region, and said electrodes being in contact with said semiconductor body through corresponding contact holes formed in an insulation film that covers the main surface of said semiconductor body; wherein at least some of the total number of said isolation regions are deep isolation regions which reach as far as said semiconductor substrate from said main surface of said semiconductor body, said deep isolation regions dividing said buried layer and said epitaxial layer into a plurality of regions that are electrically isolated.

12. A semiconductor integrated circuit device according to claim 11, wherein the material that is at least semiconducting is polycrystalline silicon.

13. A semiconductor integrated circuit device according to claim 11, wherein said emitter region has two opposite edges which are in contact with said deep isolation regions, the contact hole for said third electrode is formed so that it overlaps said deep isolation regions, and the two edges of said contact hole corresponding to the two opposite edges of said emitter region in contact with said deep isolation regions are located on said deep isolation regions.

14. A semiconductor integrated circuit device according to claim 13, wherein a portion of said third electrode is in contact with said second silicon dioxide film.

15. A semiconductor integrated circuit device according to claim 14, wherein portions of said second silicon dioxide film at which the contact hole for said third electrode overlaps said deep isolation regions are thinner than other portions of said second silicon dioxide film.

16. A semiconductor integrated circuit device according to claim 13, wherein said third electrode is made of polycrystalline silicon.

17. A semiconductor integrated circuit device according to claim 13, wherein the contact hole for said second electrode is formed overlapping said deep isolation regions such that at least two edges of said contact hole are located on said deep isolation regions.

18. A semiconductor integrated circuit device according to claim 11, wherein some of said isolation regions are shallower than said deep isolation regions and each of said shallow isolation regions substantially divides the epitaxial layer in each said isolated region in which a bipolar transistor is formed into a first region and a second region, said collector contact region being formed in said first region, said base region being formed in said second region, and said shallow isolation regions and said deep isolation regions being formed as a unitary structure.

19. A semiconductor integrated circuit device according to claim 11, wherein said second silicon dioxide film is thicker than said first silicon dioxide film.

20. A semiconductor body having isolation regions therein, formed by a process comprising the steps of:
 (a) forming grooves in a main surface of the semiconductor body so as to form groove surfaces in the semiconductor body;
 (b) after step (a), forming a silicon nitride film at least over the groove surfaces in said semiconductor body;
 (c) after step (b), forming a first silicon dioxide film at least on said silicon nitride film in said grooves;
 (d) after step (c), filling said grooves with a material that is at least semiconducting, said material, filling said grooves, having an upper surface; and
 (e) after step (d), forming a second silicon dioxide film so as to cover the upper surface of said material that is at least semiconducting, to thereby form said isolation regions.

21. A semiconductor body according to claim 20, further comprising an initial silicon dioxide on the groove surfaces, between said groove surfaces and said silicon nitride film, the initial silicon dioxide film being formed prior to forming said silicon nitride film, with said silicon nitride film being formed on said initial silicon dioxide film.

22. A semiconductor body according to claim 21, wherein said semiconductor body is made of silicon, and said initial silicon dioxide film is a film formed by thermally oxidizing silicon forming the groove surfaces.

23. A semiconductor integrated circuit device, manufactured by a process comprising the steps of:
 (a) forming grooves in one main surface of a semiconductor body by etching said semiconductor body so as to form groove surfaces in the semiconductor body;
 (b) after step (a), forming a silicon nitride film at least over the groove surfaces in said semiconductor body;
 (c) after step (b), forming a first silicon dioxide film on said silicon nitride film;
 (d) after step (c), filling said grooves with polycrystalline silicon, the polycrystalline silicon, filling the grooves, having a surface;
 (e) after step (d), forming a second silicon dioxide film so as to cover the surface of said polycrystalline silicon, by thermally oxidizing said polycrystalline silicon, to form isolation regions to define active regions in the semiconductor body; and
 (f) after step (e), forming semiconductor elements in said active regions.

24. A semiconductor body according to claim 1, wherein the second silicon dioxide film, together with the first silicon dioxide film, surround the material that is at least semiconducting.

25. A semiconductor integrated circuit device according to claim 8, wherein the second silicon dioxide film, together with the first silicon dioxide film, surround the material that is at least semiconducting.

26. A semiconductor body according to claim 3, wherein the third silicon dioxide film is a film formed by thermal oxidation.

27. A semiconductor body according to claim 1, wherein the second silicon dioxide film is a silicon dioxide film formed by thermal oxidation.

28. A semiconductor body according to claim 1, wherein the first silicon dioxide film is a film formed by depositing a silicon film on the silicon nitride film and thermally oxidizing the silicon film.

29. A semiconductor body according to claim 28, wherein the second silicon dioxide film is a silicon dioxide film formed by thermal oxidation.

30. A semiconductor body, including isolation regions for isolating semiconductor elements to be formed in said semiconductor body, comprising:
 (a) a semiconductor body having a main surface, with grooves formed in said main surface at the location of said isolation regions, the grooves providing groove surfaces in the semiconductor body;
 (b) a silicon nitride film formed at least within said grooves over the groove surfaces of the semiconductor body;
 (c) a first insulating film of an insulating oxide material, formed at least in said grooves on said silicon nitride film, said first insulating film having a thickness;
 (d) a material that is at least semiconducting formed on said first insulating film so as to fill said grooves, said material that is at least semiconducting being capable of being thermally oxidized to form an insulating oxide, said material, filling the groove, having a surface; and
 (e) a second insulating film, said second insulating film being a film of thermal oxide of the material that is at least semiconducting, which covers the surface of said material that is at least semiconducting, said second insulating film having edges adjacent the silicon nitride film, whereby the thickness of the edges of the second insulating film greater than the thickness of the first insulating film.

31. A semiconductor body according to claim 30, wherein the insulating oxide material of the first insulating film is silicon dioxide formed by thermal oxidation.

32. A semiconductor body according to claim 31, wherein the material that is at least semiconducting is polycrystalline silicon.

33. A semiconductor body according to claim 32, wherein the second insulating film is of silicon dioxide formed by thermal oxidation.

34. A semiconductor body according to claim 33, wherein the second insulating film of silicon dioxide is formed by thermal oxidation of the material that is at least semiconducting.

35. A semiconductor body according to claim 34, wherein the second insulating film, together with the first insulating film, surround the material that is at least semiconducting.

36. A semiconductor integrated circuit device provided with isolation regions for isolating elements formed in a semiconductor body by utilizing grooves that are formed by etching a main surface of said semiconductor body, the grooves having groove surfaces in the semiconductor body, said isolation regions comprising:

(a) an initial insulating film, formed on the groove surfaces in the semiconductor body;
(b) a silicon nitride film formed at least on the initial insulating film;
(c) a first insulating film, of an insulating oxide material, formed at least in said grooves on said silicon nitride film, said first insulating film having a thickness;
(d) a material that is at least semiconducting formed on said first insulating film so as to fill said grooves, said material that is at least semiconducting being capable of being thermally oxidized to form an insulating oxide, said material, filling the groove, having a surface; and
(e) a second insulating film, said second insulating film being a film of thermal oxide of the material that is at least semiconducting, which covers the surface of said material that is at least semiconducting, said second insulating film, together with said first silicon dioxide film, forming a unitary structure, said second insulating film having edges adjacent the silicon nitride film, whereby the thickness of the edges of the second insulating film is greater than the thickness of the first insulating film.

37. A semiconductor body according to claim 1, further comprising a plurality of semiconductor elements formed in the main surface of the semiconductor substrate, the plurality of semiconductor elements being isolated from each other by said isolation regions.

38. A semiconductor integrated circuit device, provided with isolation regions for isolating semiconductor elements, comprising:

(a) a semiconductor body having a main surface, with grooves formed in said main surface at locations of said isolation regions, the grooves having groove surfaces in the semiconductor body with the semiconductor elements being formed in the semiconductor body;
(b) a silicon nitride film formed at least over the groove surfaces of said semiconductor body within said grooves;
(c) a first insulating film, of an insulating oxide material, formed at least in said grooves on said silicon nitride film, the first insulating film having a thickness;
(d) a material that is at least semiconducting formed on said first insulating film so as to fill said grooves, said material, filling said grooves, having an upper surface, said material that is at least semiconducting being capable of being thermally oxidized to form an insulating oxide; and
(e) a second insulating film, said second insulating film being a film of thermal oxide of the material that is at least semiconducting, which covers the upper surface of said material that is at least semiconducting, and wherein said second insulating film has edges, said edges having a thickness greater than the thickness of said first insulating film.

* * * * *